US006815610B2

(12) United States Patent
Kuboshima et al.

(10) Patent No.: US 6,815,610 B2
(45) Date of Patent: Nov. 9, 2004

(54) ELECTROMAGNETIC SHIELDING STRUCTURE

(75) Inventors: Hidehiko Kuboshima, Haibara-gun (JP); Hirotaka Fukushima, Haibara-gun (JP); Sakai Yagi, Haibara-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/667,409

(22) Filed: Sep. 23, 2003

(65) Prior Publication Data

US 2004/0057187 A1 Mar. 25, 2004

(30) Foreign Application Priority Data

Sep. 24, 2002 (JP) .................................... P2002-277195

(51) Int. Cl.[7] .................................................. H05K 9/00

(52) U.S. Cl. .................... 174/35 C; 174/65 R; 439/98; 439/939

(58) Field of Search .......................... 174/35 C, 35 GC, 174/35 R, 35 MS, 65 R, 51; 439/95, 98, 101, 108, 607, 939

(56) References Cited

U.S. PATENT DOCUMENTS 5,691,506 A * 11/1997 Miyazaki et al. ......... 174/65 R
6,042,396 A * 3/2000 Endo et al. ................... 439/98
6,261,108 B1 7/2001 Kanagawa et al.
6,344,612 B1 2/2002 Kuwahara et al.
6,358,069 B2 * 3/2002 Yoshioka et al. ........... 439/108
6,419,521 B2 7/2002 Kanagawa et al.
6,524,121 B2 * 2/2003 Kanagawa .................. 439/98

FOREIGN PATENT DOCUMENTS

JP 6-23179 3/1994

* cited by examiner

*Primary Examiner*—Dean A. Reichard
*Assistant Examiner*—Carmelo Oliva
(74) *Attorney, Agent, or Firm*—Sughrue Mion, PLLC

(57) ABSTRACT

An electromagnetic shielding structure includes a sheath wire having a conductive wire and an insulative sheath covering the conductive wire; a terminal fitting clamping the conductive wire exposed from the insulative sheath, and the terminal fitting passing through a conductive mounting member connected to ground; a molding member molded to cover the exposed conductive wire and the terminal fitting, and having a first recess and a second recess; a conductive braid having a tubular shape, and covering the sheath wire and the molding member for absorbing an electromagnetic wave generated from the conductive wire; a first sealing portion provided in the first recess so as to adhere the molding member and the insulative sheath for securing a waterproof performance; a second sealing portion provided in the second recess so as to adhere the molding member and the terminal fitting for securing an oil proof and waterproof performance; and a conductive shell covering the molding member so that the conductive braid is electrically connected to the conductive mounting member. The first recess is formed on a first end portion of the molding member. The first end portion contacts the sheath wire. The second recess is formed on a second end portion of the molding member. The second end portion contacts the terminal fitting.

6 Claims, 15 Drawing Sheets

ELECTROMAGNETIC SHIELDING STRUCTURE

BACKGROUND OF THE INVENTION

This invention relates to a waterproof/oilproof electromagnetic shielding structure used at a portion where electric wires (cables) are connected respectively to input/output terminals of a motor of an electric car or an ordinary electronic/electric equipment.

Recently, small current circuits and electronic circuits have increasingly been used in automobiles, and installed wires have now had a large-current/high-voltage design, and under these circumstances, it has been required to provide effective and inexpensive electromagnetic shielding measures which protect the small current circuits liable to be affected by electromagnetic noises, and will not lower the detection precision of various sensors in the electronic circuits under the influence of electromagnetic noises.

In a related electromagnetic shielding structure, a plurality of pin terminals 3 are held by a terminal-holding retainer 2 provided within a cylindrical metal shell 1, as shown in FIG. 14 which is a side cross-sectional view. A shielded cable 4, shown in FIG. 14, comprises a plurality of twisted insulated core wires 5 each having a conductor 5*a* covered with an insulator 5*b*, a metal braid 6 wound on the twisted core wires 5, and an outermost sheath 7 covering this metal braid. The insulator is removed from an end portion of each insulated core wire 5 of the shielded cable 4, and the exposed conductors 5*a* of the core wires 5 are connected to the pin terminals 3, respectively.

The sheath 7 is removed from an end portion of the cable, thereby exposing the braid 6, and a tubular metal net 8 is fitted on a skirt-like end portion of the braid 6, and further a heat-shrinkable tube 9 is fitted on the metal net 8. The heat-shrinkable tube 9 is heated to tighten the metal net 8 by its shrinking pressure, so that the metal net 8 is pressed against an outer peripheral surface of the metal shell 1, and therefore is connected thereto, thereby electrically connecting the braid 6 to the metal shell 1, thus achieving an electromagnetic shielding effect (see, for example, JP-UM-A-6-23179 (Page 2, FIG. 1)).

One known electric connector, employing an electromagnetic shielding structure different from the above electromagnetic shielding structure, is shown in FIG. 15 although such an electric connector is not clearly disclosed in any technical literature. Namely, in this case, a shielded wire (or shielded cable) 20 includes an insulator 22 covering a conductor 21, an outermost sheath 23 covering the insulator 22. A braid 24, serving as a shielding layer, is embedded between the inner and outer layers, that is, the insulator 22 and the sheath 23, and generated electromagnetic waves are absorbed by the braid 24. A metal terminal 25 is press-fastened to the conductor 21 at a distal end of the wire, and this metal terminal 25 is connected to an input/output terminal of an equipment.

In this case, the sheath 23 is removed from the distal end portion of the shielded wire 20, thereby exposing the braid 24 and the insulator 22 (which are disposed within this sheath), and an end portion of the exposed braid 24 is connected to a metal collar 26 and a mounting bracket 29 made of metal. The mounting bracket 29 is connected to a casing of the equipment connected to the ground. The braid 24 is connected to the equipment casing via the metal collar 26 and the mounting bracket 29, thereby achieving a shielding conduction, and electromagnetic waves, generated from the shielded wire 20, are absorbed by a shielding conduction path. Molten resins are injected to cover a shield connecting portion of the braid 24, thereby forming an inner covering molded portion 28A and an outer covering molded portion 28B by a two-color molding method. In this manner, the electric connector, having the electromagnetic shielding structure, is formed.

The electromagnetic shielding structures of the electric connectors, shown respectively in Patent Literature 1 and FIG. 15, have the following problems.

First, in the case of the related structure of FIG. 14 disclosed in Patent Literature 1, the metal net 8 (which is a cumbersome connecting member) is used to electrically connect the braid 6 to the metal shell 1 for shielding purposes, and this metal net 8 is pressed against the metal shell 1 by the use of the heat-shrinkable tube 9. The number of the expensive component members, including the metal net 8 and the heat-shrinkable tube 9, increases, and therefore this is disadvantageous from the viewpoint of the cost. And besides, the force for sufficiently pressing the metal net 8 against the metal shell 1 can not be obtained only by the heat-shrinking force of the heat-shrinkable tube 9. Therefore, a shielding resistance is unstable, so that the effective electromagnetic shielding can not be effected, and therefore the reliability of the shielding-purpose connection of the braid 6 to the metal shell 1 is affected. In addition, if the heat-shrinkable tube should be damaged or ruptured, the metal net 8 is displaced out of position, and fails to serve to interconnect the metal shell 1 and the braid 6, thus causing electrical disconnection, and this leads to a possibility that the intended electromagnetic shielding function is adversely affected.

In the case of the structure of FIG. 15, in order to connect the braid 24 of the shielded wire 20 to the equipment casing or the like, the metal collar 26 and the metal mounting bracket 29 are used as the relay members for the shielding-purpose connection. And besides, after the braid 24 is connected to the mounting bracket 29, the inner and outer covering molded portions 28A and 28B are formed. Namely, the number of the component members is large, and besides the production process up to the molding step is very complicated, and naturally the production cost increases. In addition, the covering molded portions 28A and 28B adhere to the sheath 23 and insulator 22 of the shielded wire 20 which are molded of different resin materials, respectively, and further adhere to the metal collar 26 and the metal mounting bracket 29. In view of physical properties, it is difficult to think that when a layer, adhering to resins of different natures or metals of different natures, is molded by the use of the same resin, a sufficient adhesion is obtained in an interface, and thus there is encountered a structural problem.

A further problem which is common to the structure of FIG. 14 (disclosed in Patent Literature 1) and the structure of FIG. 15 is that the conductor and the metal terminal are exposed, and a waterproof ability for preventing the intrusion of rain water from the exterior and an oil leakage prevention ability for preventing the leakage of oils (such as lubricating oil used in the equipment) to the exterior are not taken into consideration. Particularly in the case of the latter structure shown in FIG. 15, there is a fear that oil, such as lubricating oil used in the equipment, leaks to the exterior via the conductor 21 of the distal end portion of the shielded wire 20 and the metal terminal 25, and adversely affects other equipment. In the case of the molded electric connector, the durability for a change of properties upon deposition of rain water is different from the durability for a change of properties upon deposition of oil, and the resin material of an ordinary nature, forming the covering molded portions 28A and 28B, can not meet such required characteristics for water and oil.

SUMMARY OF THE INVENTION

It is therefore an object of this invention to provide an electromagnetic shielding structure with an oilproof and waterproof ability which achieves a satisfactory shielding performance particularly against electromagnetic waves from an installed large-current/high-voltage cable at low costs, and also has a required oilproof and waterproof performance against rain water and oils.

In order to achieve the above object, according to the present invention, there is provided an electromagnetic shielding structure, comprising:

a sheath wire, having a conductive wire and an insulative sheath covering the conductive wire;

a terminal fitting, clamping the conductive wire exposed from the insulative sheath, and the terminal fitting passing through a conductive mounting member connected to ground;

a molding member, molding so as to cover the sheath wire, the exposed conductive wire and the terminal fitting, and having a first recess and a second recess;

wherein the first recess is formed on a first end portion of the molding member, the first end portion contacting the sheath wire;

wherein the second recess is formed on a second end portion of the molding member, the second end portion contacting the terminal fitting;

a conductive braid, having a tubular shape, and covering the sheath wire and the molding member for absorbing an electromagnetic wave generated from the conductive wire;

a first sealing portion, provided in the first recess so as to adhere the molding member and the insulative sheath for securing a waterproof performance;

a second sealing portion, provided in the second recess so as to adhere the molding member and the terminal fitting for securing an oil proof and waterproof performance; and a conductive shell, covering the molding member so that the conductive braid is electrically connected to the conductive mounting member.

Preferably, a end portion of the conductive braid and the conductive shell are mounted on the mounting member by a bolt.

Preferably, the first sealing portion is formed by filing a melted resin into the first recess.

Preferably, the second sealing portion is formed by filing a melted resin into the second recess.

In the above construction, the braid, covering the wire, and the conductive shell (such for example as a metal cover) are fastened together by the fastening bolts, and are connected to the conductive mounting member (such for example as a motor outer plate casing), thereby connecting the braid to the ground. Therefore, electromagnetic waves, generated from the wire, can be positively absorbed by the inexpensive connecting structure, thus obtaining the required electromagnetic shielding function. In the covering molded portion which covers and protects the conductor at the wire end portion and the metal terminal press-fastened to this conductor, the first sealing portion is provided in the first recess formed in that side of the molded body contacting the insulator at the wire end portion. Therefore, rain water or the like, intruding along the exposed conductor at the wire end portion, is intercepted, thereby securing the required waterproof performance. And besides, the second sealing portion is provided in the second recess formed in that side of the molded body disposed close to the connection portion of the metal terminal, and therefore oil, such as lubricating oil used in the equipment (e.g. the motor outer plate casing), and water drops are prevented from leaking to the exterior along the metal terminal, thereby securing the required oilproof and waterproof performance.

The first sealing portion of an arbitrary shape can be post-provided in the first recess in accordance to an outer diameter of the wire or others, and the oilproof and first sealing portion of an arbitrary shape can be post-provided in the second recess in accordance with a shape of the metal terminal.

In the above construction, the first and second seal member-mounting recesses are beforehand formed in the molded body, and therefore in accordance with the outer diameter of the wire and the shape and kind of the metal terminal, the suitable resins are poured respectively into the first and second recesses at a later stage, so that the first sealing portion and the second sealing portion can be post-molded. Therefore, this construction can easily meet the use of the inexpensive wire and metal terminal or the use of the expensive wire and metal terminal, thus achieving the enhanced general-purpose ability.

Instead of the first sealing portion and the second sealing portion formed by pouring the resins, for example, tubular packing-like members, molded of elastic rubber, can be post-fitted in the first sealing portion and the second sealing portion, respectively.

According to the present invention, there is also provided an electromagnetic shielding structure, comprising:

a sheath wire, having a conductive wire and an insulative sheath covering the conductive wire;

a terminal fitting, clamping the conductive wire exposed from the insulative sheath, and the terminal fitting passing through a conductive mounting member connected to ground;

a grommet, covering the sheath wire and the terminal fitting, and having a first end portion and a second end portion, the first end portion being closely contact with the insulative sheath;

a conductive braid, having a tubular shape, and covering the sheath wire and the grommet for absorbing an electromagnetic wave generated from the conductive wire;

a housing, formed with a recess at a distal end side of the terminal fitting, the housing fitting the terminal fitting, and being closely contact with the second end portion of the grommet;

a sealing portion, provided in the recess so as to adhere the housing and the terminal fitting for securing an oil proof and waterproof performance;

a conductive shell, covering the molding member and the grommet; and a shield stopper, fixedly secured to the conductive shell, and holding the housing in the conductive shell.

In the above construction, the satisfactory shielding performance can be obtained at low costs particularly for electromagnetic waves generated from the installed wire carrying large current and high voltage. And besides, the required oilproof and waterproof performance against rain water and oil can be secured.

According to the present invention, there is also provided an electromagnetic shielding structure, comprising:

a sheath wire, having a conductive wire and an insulative sheath covering the conductive wire;

a terminal fitting, clamping the conductive wire exposed from the insulative sheath, and the terminal fitting passing through a conductive mounting member connected to ground;

a grommet, covering the sheath wire and the terminal fitting, and having a first end portion and a second end portion, the first end portion being closely contact with the insulative sheath;

a conductive braid, having a tubular shape, and covering the sheath wire and the grommet for absorbing an electromagnetic wave generated from the conductive wire;

housing, fitting the terminal fitting;

a heat-shrinkable tube, sealing the housing and the terminal fitting, and closely fitted with the second end portion of the grommet;

a conductive shell, covering the housing and the grommet; and a shield stopper, fixedly secured to the conductive shell, and holding the housing in the conductive shell.

In the above construction, the satisfactory shielding performance can be obtained at low costs particularly for electromagnetic waves generated from the installed wire carrying large current and high voltage. And besides, the required oilproof and waterproof performance against rain water and oil can be secured.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

A preferred embodiment of the invention will now be described.

FIGS. 1 to 6 shows the first embodiment of an oilproof/waterproof electromagnetic shielding structure of the invention.

Figure 1:
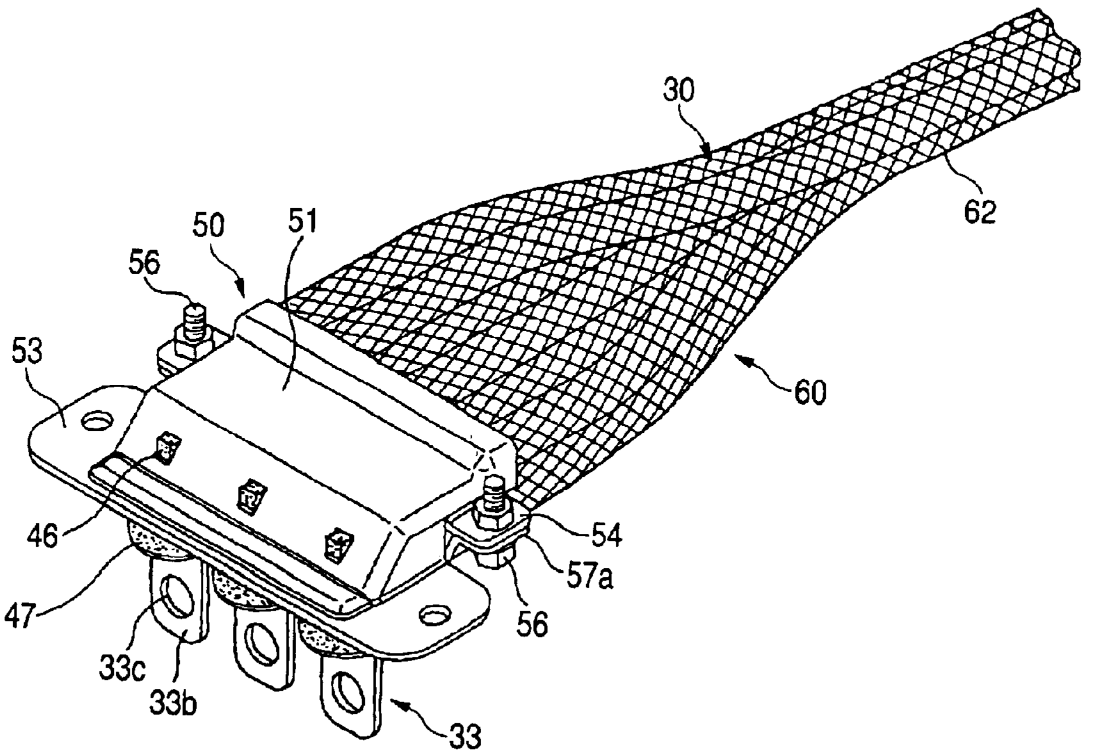
FIG. 1 is a perspective view showing a first embodiment of an electric connector of the invention, employing an electromagnetic shielding structure with an oilproof and waterproof ability, in its assembled condition.
Figure 2:
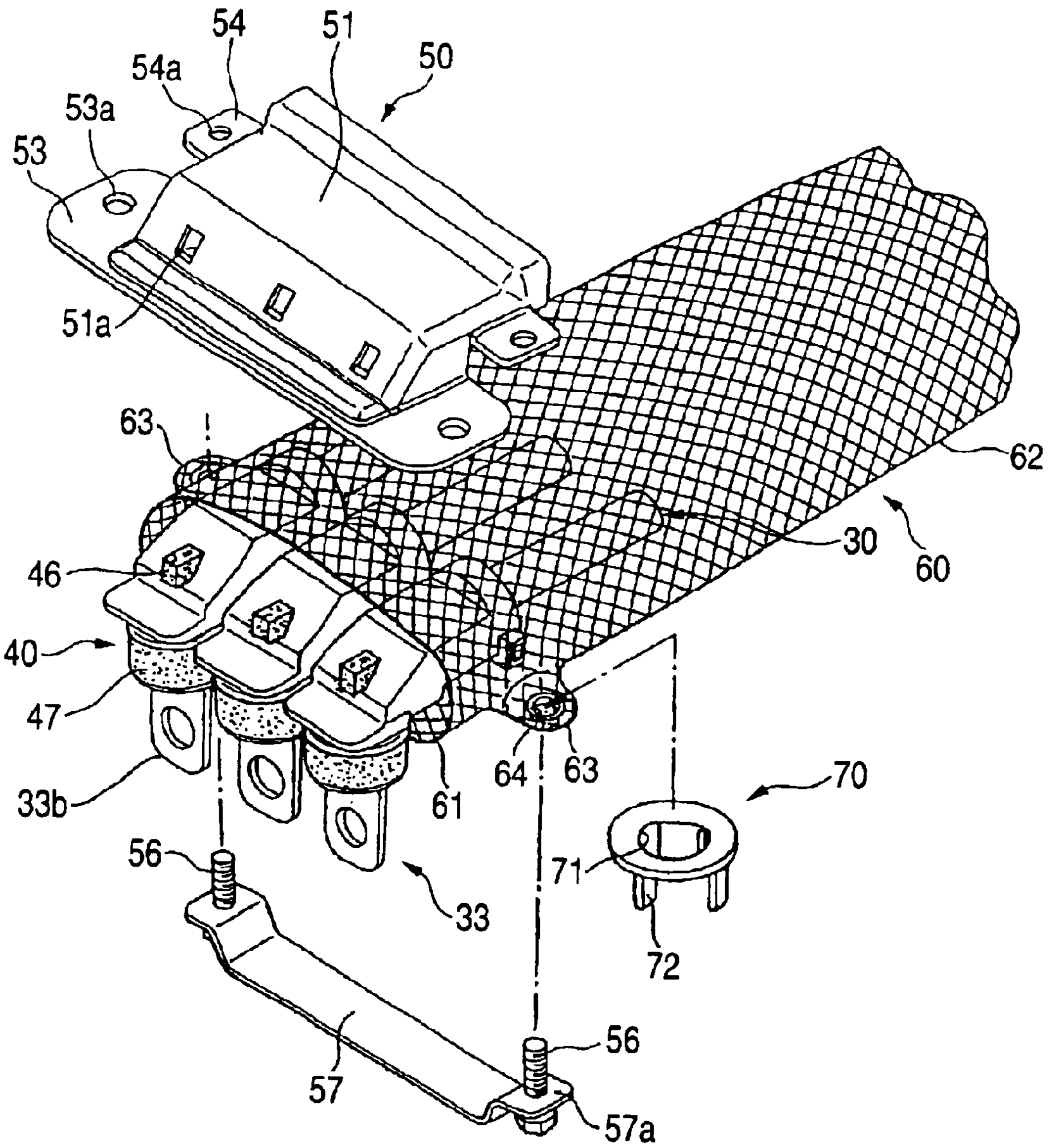
FIG. 2 is an exploded, perspective view of the first embodiment.
Figure 3:
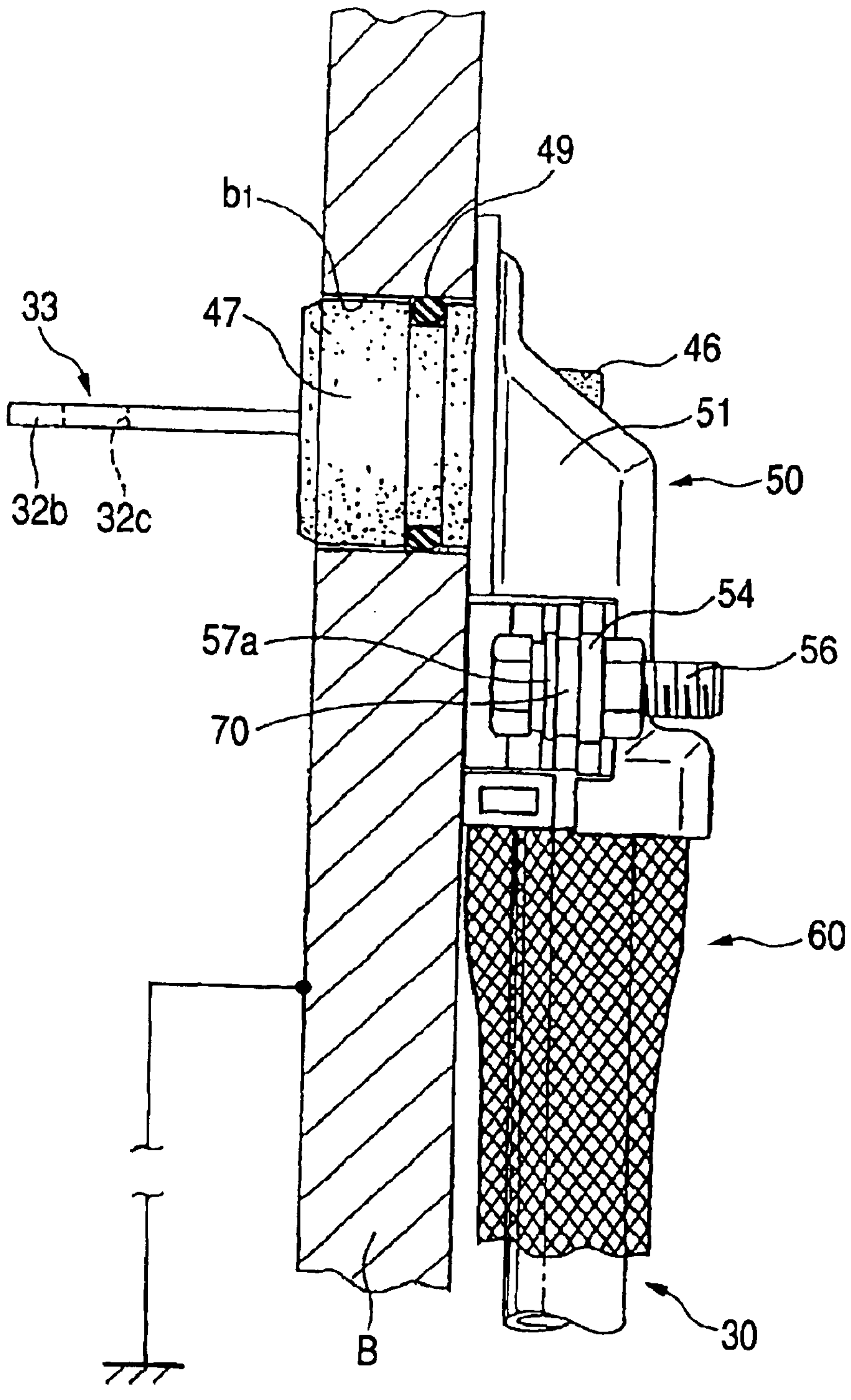
FIG. 3 is a side-elevational view of the first embodiment in its assembled condition, showing a condition in which this structure is connected to a motor outer plate casing serving as a mounting member.
Figure 4:
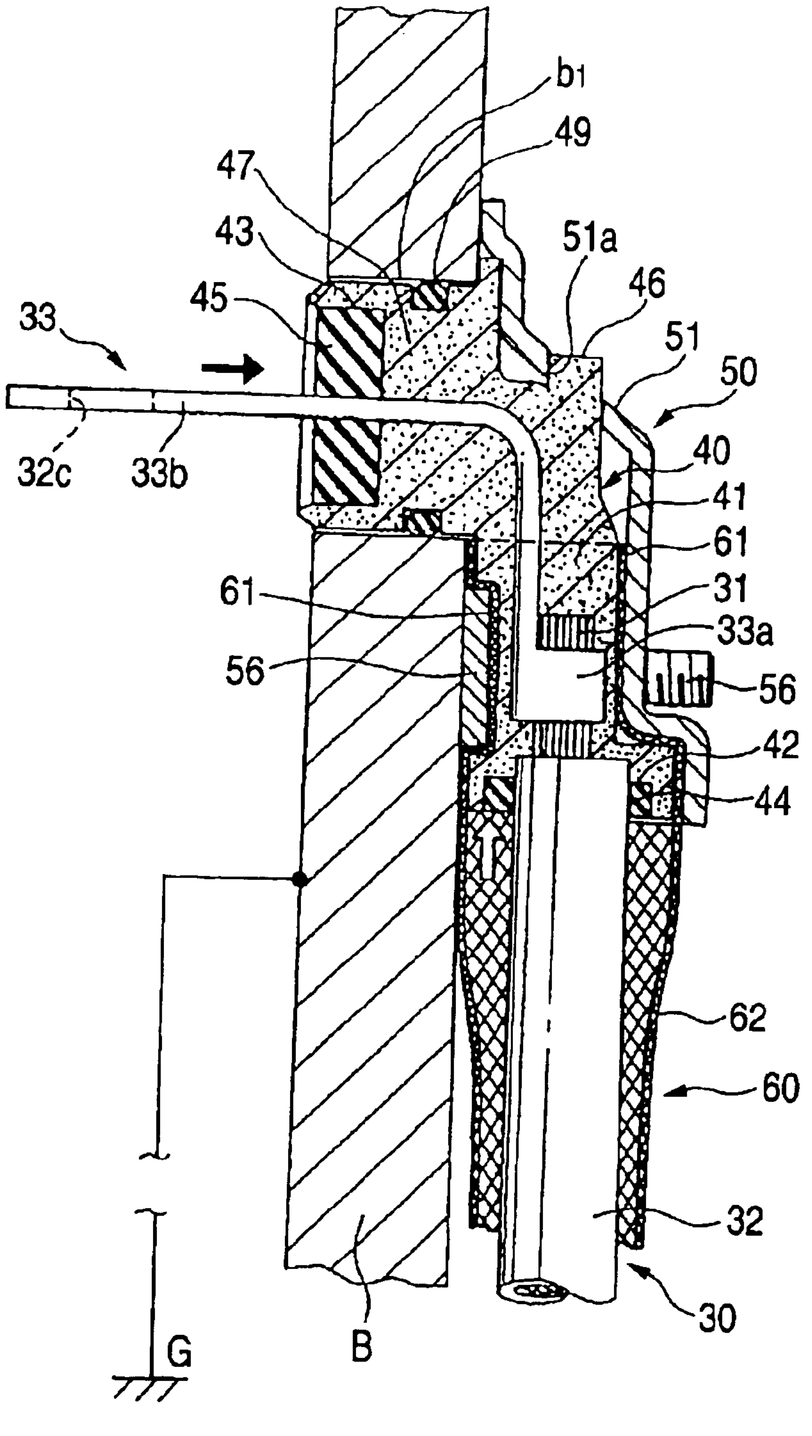
FIG. 4 is a cross-sectional view of the first embodiment in its assembled condition, showing the condition in which this structure is connected to the motor outer plate casing serving as the mounting member.
Figure 5:
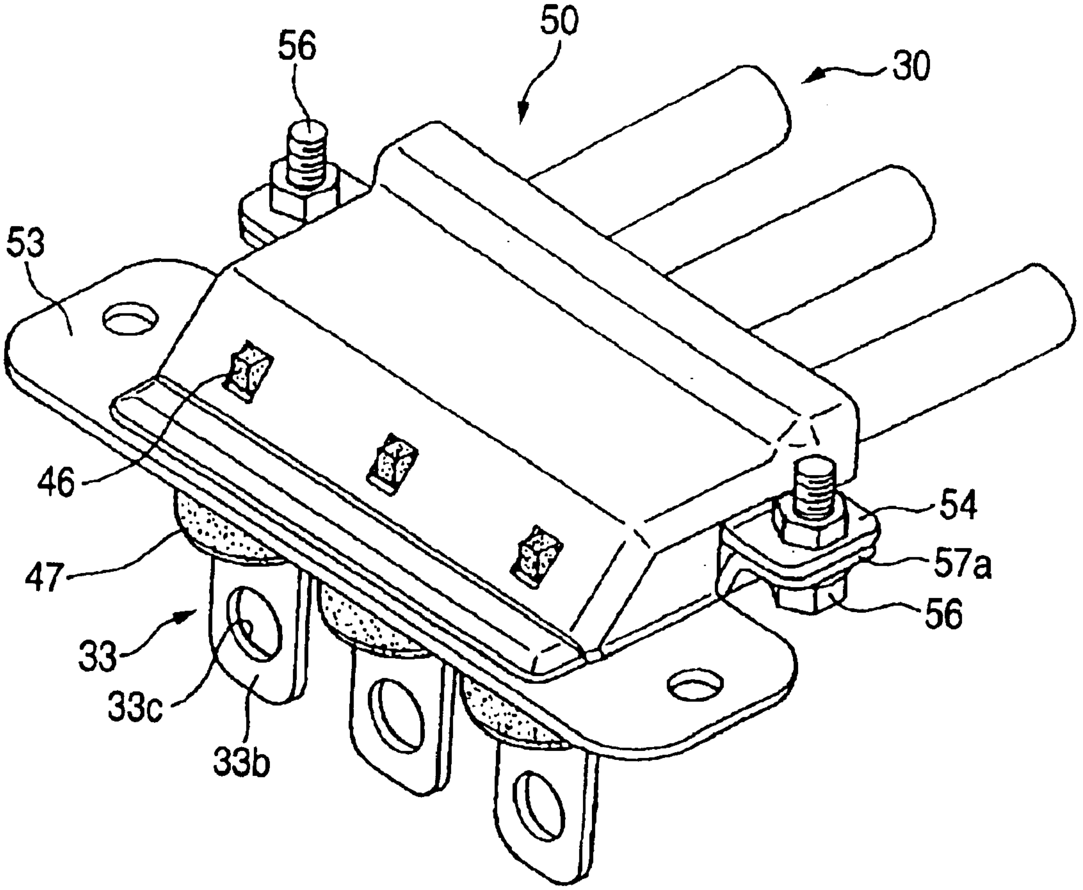
FIG. 5 is a perspective view of the first embodiment in its assembled condition, with a braid not attached.
Figure 6:
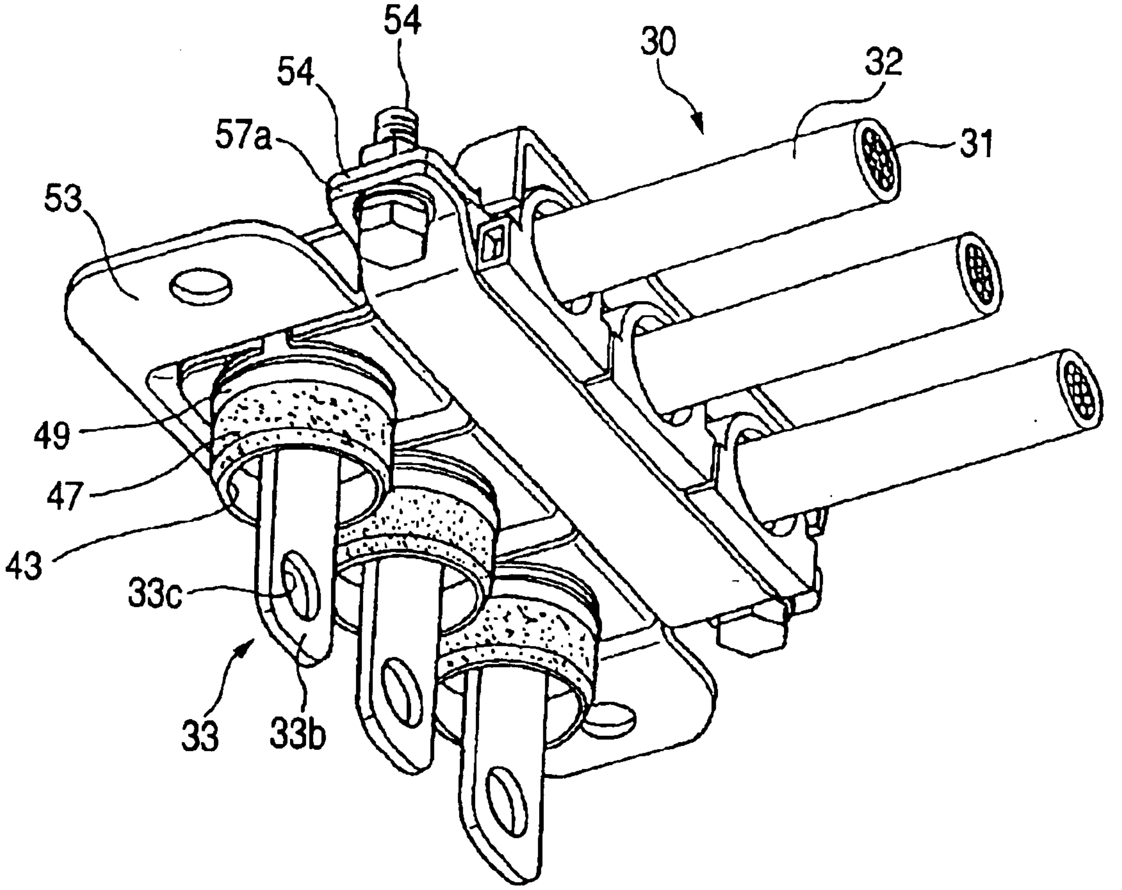
FIG. 6 is a perspective view of the first embodiment in its assembled condition, showing a condition before oilproof/waterproof sealing portions which are an important portion of the invention are post-provided in sealing resin-filling recesses, respectively.

FIG. 1 is a perspective view showing the whole of an electric connector employing the electromagnetic shielding structure with the oilproof and waterproof ability, FIG. 2 is an exploded, perspective view of the electric connector of FIG. 1, FIG. 3 is a view showing a condition in which the electric connector, employing the electromagnetic shielding structure with the oilproof and waterproof ability, is mounted on a mounting member, FIG. 4 is a cross-sectional view of the electric connector of FIG. 3, FIG. 5 is a perspective view showing the whole of the electric connector of FIG. 1, with a braid not attached, and FIG. 6 is a perspective view showing the whole of the electric connector of FIG. 1 (to which the braid is not attached) from the lower side.

In FIGS. 1 to 4, L-shaped metal terminals 33 are press-fastened to distal end portions of three wires 30, respectively, and the three wires 30 are covered with the braid 60 formed by weaving electrically-conductive wire elements into a tubular shape. This braid 60 absorbs electromagnetic waves, generated from the wires 30 carrying, for example, large current and high voltage, and therefore the braid 60 shields these wires 30 so that the electromagnetic waves will not be radiated to the exterior. The braid 60, serving as a shielding member, is formed by weaving metal wire elements, and another well known type is formed by a method in which a Cu-plated wire element is spirally wound around a wire, made of a resin such as polyester, to provide a mesh-forming wire element, and these mesh-forming wire elements are woven into a tubular shape. A resin is molded to cover the distal end portions of the three wires 30 covered by the braid 60, thereby providing the electric connector including various members described below.

This electric connector includes a covering molded portion 40 which is resin-molded to cover the whole of the distal end portions of the wires in such a manner that connection portions 33*b*, provided respectively at distal ends of the metal terminals 33, remain intact (that is, remain uncovered). First seal member-mounting recesses 42 are formed in one end surface of a molded body 41 of the covering molded portion 40 which faces ends of insulators 32 of the wire end portions. Second seal member-mounting recesses 43 are formed in the other end surface of the molded body 41 disposed close to the connection portions 33*b* of the metal terminals 33 projecting respectively from the wire end portions.

At a later stage, a resin material, different from the resin material of the molded body 41, is poured into each of the first recesses 42 in the molded body 41 to form a waterproof sealing portion 44. This waterproof sealing portion 44 is molded to adhere to the surface of the insulator 32, and a hot-melt resin or an epoxy resin is used as the resin material for this waterproof sealing portion 44. Also, at a later stage, a resin material, different from the resin material of the waterproof sealing portion 44, is poured into each of the second recesses 43 to form an oilproof and waterproof sealing portion 45. The connection portions 33*b* project respectively from the oilproof and waterproof sealing portions 45. As the material for the oilproof and waterproof sealing portion 45, there is used a hot-melt resin or an epoxy resin which has such characteristics as to adhere to the two members of different natures (that is, the molded body 41, made of the resin, and the metal terminals 33 made of metal).

A skirt-like end portion of the braid 60 is spread, and covers the rear portion of the molded body 41 of the above construction. Superposed portions 63, each formed by superposing part of the tubular braid body together, are formed near to the skirt-like end portion 61. An eyelet washer 70 (shown in FIG. 2) is fixed to a hole 64 in each superposed portion 63, and the shirt-like end portion 61 is fastened to a metal cover 50 (electrically-conductive shell described later) and a fixing band 57 by fastening bolts 56 each passing through a corresponding bracket portion 57*a* of the fixing band 57 and a corresponding bracket 54 of the metal cover 50.

The rear portion of the molded body 41 is covered with the skirt-like end portion 61 of the braid 60, and this skirt-like end portion 61 is covered with the metal cover 50. The metal cover 50 is so shaped and sized as to completely cover the outer surface of the covering molded portion 40, and brackets 53 as well as the brackets 54 are formed at opposite ends of a cover body 51, respectively. Each bracket 54, the braid 60, the corresponding eyelet washer 70 and the fixing band 57 (described later) are fastened together by the fastening bolt 56. Positioning holes 51*a* are formed through a front wall of the cover body 51, and positioning ribs 46, formed on and projecting from the front side of the molded body 41, are engaged respectively in these positioning holes 51*a*, thereby provisionally positioning the molded body 41 and the cover body 51 relative to each other.

There is provided the strap-like fixing band 57 which is the mating member for the metal cover 50. The fixing band 57, together with the braid 60 and the eyelet washers 70, is fastened to the metal cover 50 through the bracket portions 57*a* (formed respectively at the opposite ends of the fixing band 57) by the fastening bolts 56, so that the molded body 41 is held between the metal cover 50 and the fixing band 57.

As described above, the rear portion of the molded body 41 is covered with the skirt-like end portion 61 of the braid 60 covering the three wires 30, and the molded body 41 and the skirt-like end portion 61 are held between the metal cover 50 and the fixing band 57, and these are fastened together by the fastening bolts 56, thereby forming the electric connector.

FIGS. 5 and 6 show the electric connector to which the braid 60 is not attached, and are perspective views showing the electric connector in its assembled condition from different angles before the waterproof sealing portions 44 and the oilproof and waterproof portions 45 are formed by pouring the resins into the first and second recesses 42 and 43.

Next, the operation of the electromagnetic shielding structure of this embodiment, having the oilproof and waterproof ability, will be described.

As shown in FIGS. 3 and 4, the front portion 47 of the molded body 41 of the covering molded portion 40 of the electric connector is fitted, for example, in a wire lead-in port b1 formed in an outer plate casing B (made of electrically-conductive metal such as aluminum) of a motor mounted on an electric car, thereby provisionally positioning the electric connector. The outer plate casing B is connected to the ground G. After this provisional positioning operation is effected, the brackets 53 of the metal cover 50 are connected and fixed to the outer plate casing B by fastening bolts (not shown).

Electromagnetic waves, generated from the wires 30 during the operation of the motor, are absorbed by shielding conduction paths leading from the superposed portions 63 (formed respectively at the opposite sides of the skirt-like end portion 61 of the braid 60) via the eyelet washers 70 to the metal cover 50 and the fixing band 57 and further to the ground G via the outer plate casing B.

When rain water intrudes along the outer peripheral surface of the wire 30 as indicated by a void arrow in FIG. 4, this rain water is intercepted by the waterproof sealing portion 44 in the covering molded portion 40, and will not reach the interior of the outer plate casing B, thus securing the required waterproof performance.

On the other hand, when oil (such as motor lubricating oil) within the outer plate casing B deposits on the connection portion 33*b* at the distal end of the metal terminal 33, and moves therealong, this oil is intercepted by the oilproof and waterproof sealing portion 45, and will not leak from the outer plate casing B to the exterior, and therefore will not adversely affect other equipments. Thus, the oilproof performance is secured. And besides, if water drops, developing within the outer plate casing B, deposit on the connection portion 33*b* at the distal end of the metal terminal 33, and tend to leak to the exterior of the casing, the water drops are intercepted by the oilproof and waterproof sealing portion 45 as described above for the oil.

Therefore, the waterproof sealing portions 44, provided at the one end portion of the covering molded portion 40, are made of a material which will not be deteriorated by water even when rain water or the like, tending to intrude into the interior of the electric connector along the wires 30, deposit on the insulators 32 of the wire end portions. On the other hand, the oilproof and waterproof sealing portions 45, provided at the other end portion of the covering molded portion 40, are made of a material which will not be deteriorated by oil and water even when oil or water within the outer plate casing B deposit on these oilproof and waterproof sealing portions 45. The oilproof and waterproof sealing portion 45 is molded of the material which is congenial to both of the metal terminal 33 and the resin-molded body 41, and can maintain the adhesion in the contact interface as described above.

The first recesses 42, in which the waterproof sealing portions 44 are post-molded, are formed in the one end portion of the molded body 41, while the second recesses 43, in which the oilproof and waterproof sealing portions 45 (whose material is different from that of the waterproof sealing portions 44) are post-molded, are formed in the other end portion of the molded body 41. The reason for this is as follows. In this embodiment, the metal terminal 33 includes a press-clamping portion 33*a* for being press-fastened by pressing to a conductor 31 of the wire, and the connection portion 33*b* which is formed at the distal end of the L-shaped terminal body, and has a bolt hole 33*c* through which the connection portion 33*b* is connected by a bolt to an output terminal of the motor of the equipment. And, this metal terminal 33 is formed by processing a flat metal material. In contrast with such inexpensive flat metal terminals, there are well known expensive metal terminals pressed into a tubular shape, which metal terminals are called "power terminals". According to selected ones of such metal terminals of various shapes and kinds, the waterproof sealing portions 44 and the oilproof and waterproof sealing portions 45 can be post-molded by filling the suitable resins in the first and second recesses 42 and 43, and therefore the general-purpose ability is enhanced.

In the above embodiment, the waterproof sealing portions 44 and the oilproof and waterproof sealing portions 45 are post-molded by filling the resins in the first and second recesses 42 and 43. However, instead of using such a resin-pouring method, tubular packings molded of elastic rubber can be mounted in the waterproof sealing portions 44 and the oilproof and waterproof sealing portions 45, respectively.

In this embodiment, the braid 60 is fastened at the superposed portions 63 to the metal cover 50 and the fixing band 57 through the electrically-conductive eyelet washers 70 by the fastening bolts 56, and this eyelet washer 70 is shown on an enlarged scale in FIG. 2. The eyelet washer 70 has the same electromagnetic shielding terminal function as that of the metal cover 50 and fixing band 57 electrically connected to the outer plate casing B of the motor for shielding purposes. For example, this eyelet washer is formed by blanking a disk-shaped piece from a metal sheet by pressing or the like, and this disk-shaped piece has a bolt hole 71 for the passage of the fastening bolt 56 therethrough. A pair of opposed braid-fixing claws 72 extend perpendicularly from an inner edge of the bolt hole 71. The braid-fixing claws 72 are bent outwardly, thereby press-fastening the eyelet washer to the superposed portion 63 of the braid 60.

FIGS. 7 to 12 show a second embodiment of an oilproof/waterproof electromagnetic shielding structure of the invention.

Figure 7:
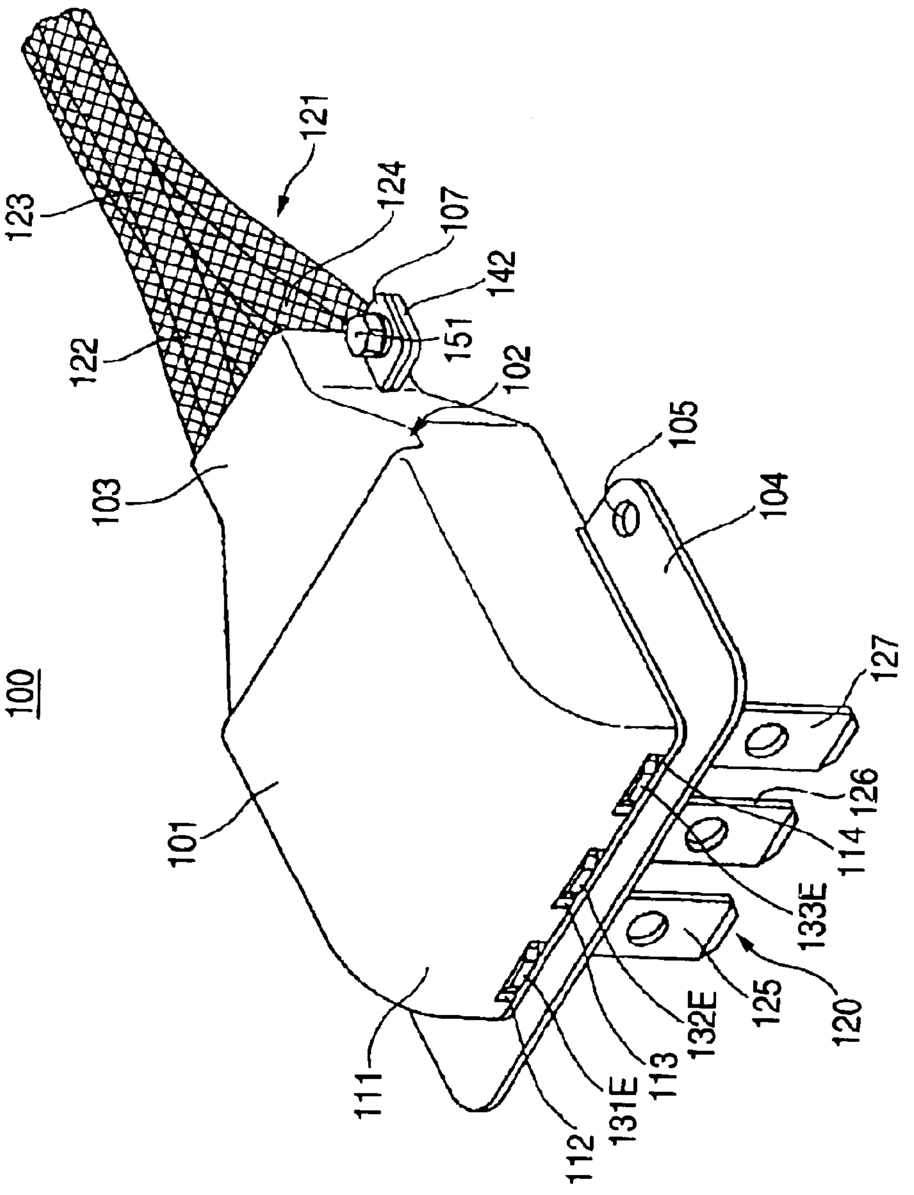
FIG. 7 is a perspective view showing the whole of a second embodiment of an electric connector of the invention employing an electromagnetic shielding structure with an oilproof and waterproof ability.
Figure 8:
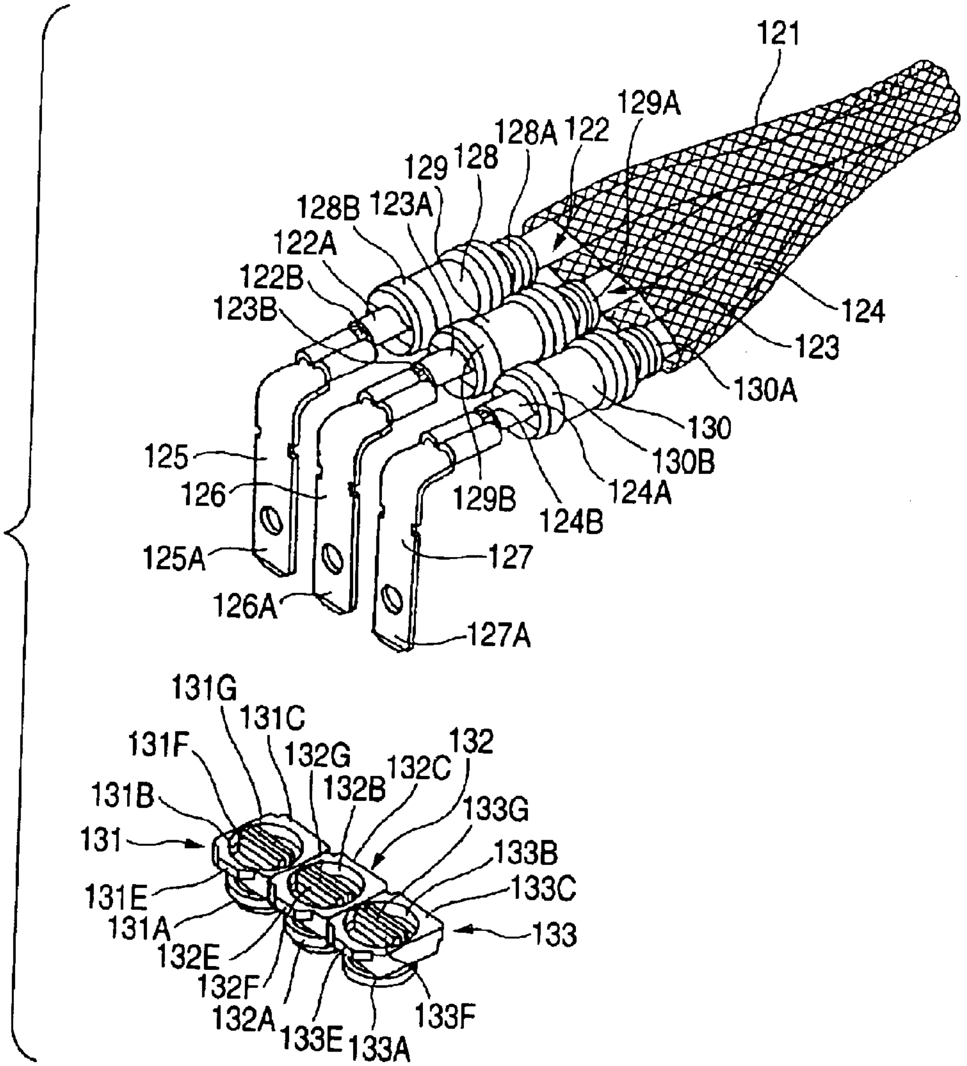
FIG. 8 is a perspective view of the electric connector of FIG. 7 in its assembled condition.
Figure 9:
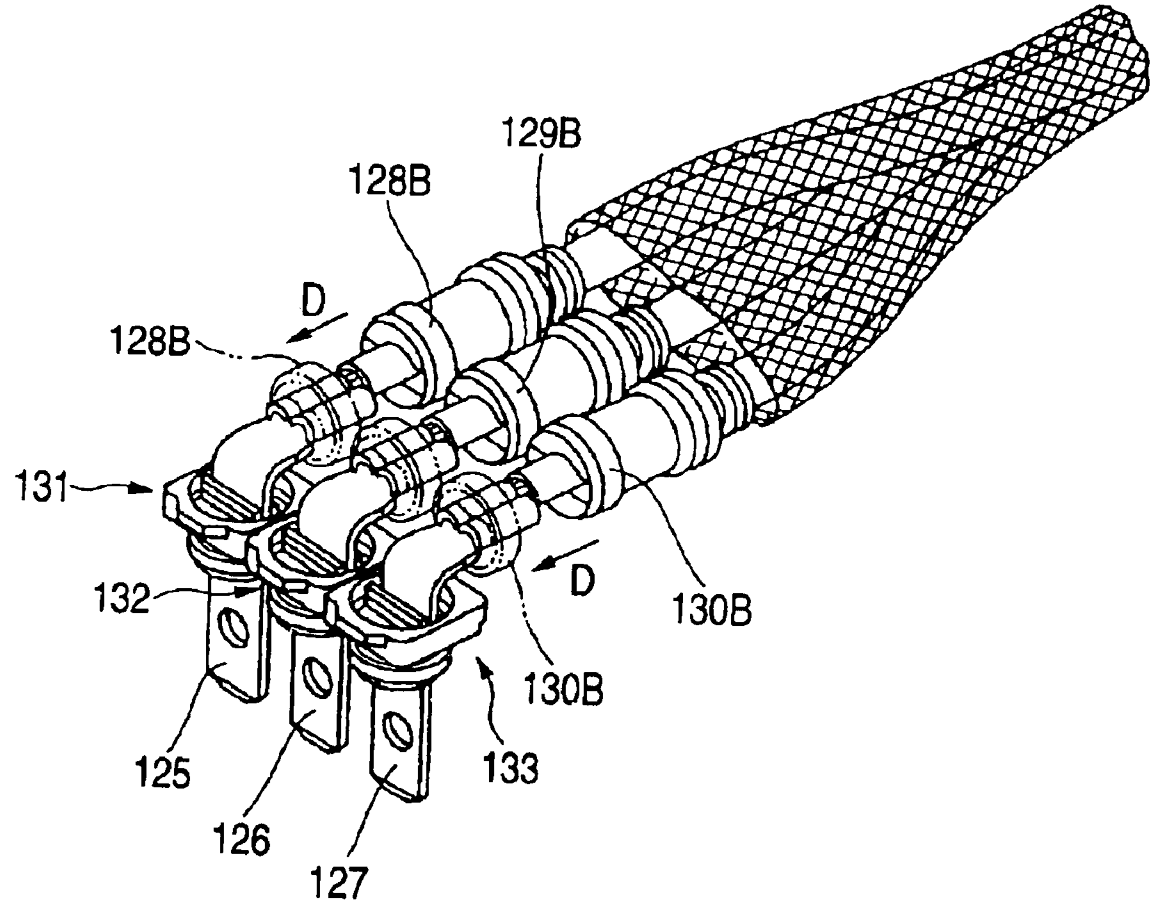
FIG. 9 is a perspective view of the electric connector of FIG. 7 in its assembled condition.
Figure 10:
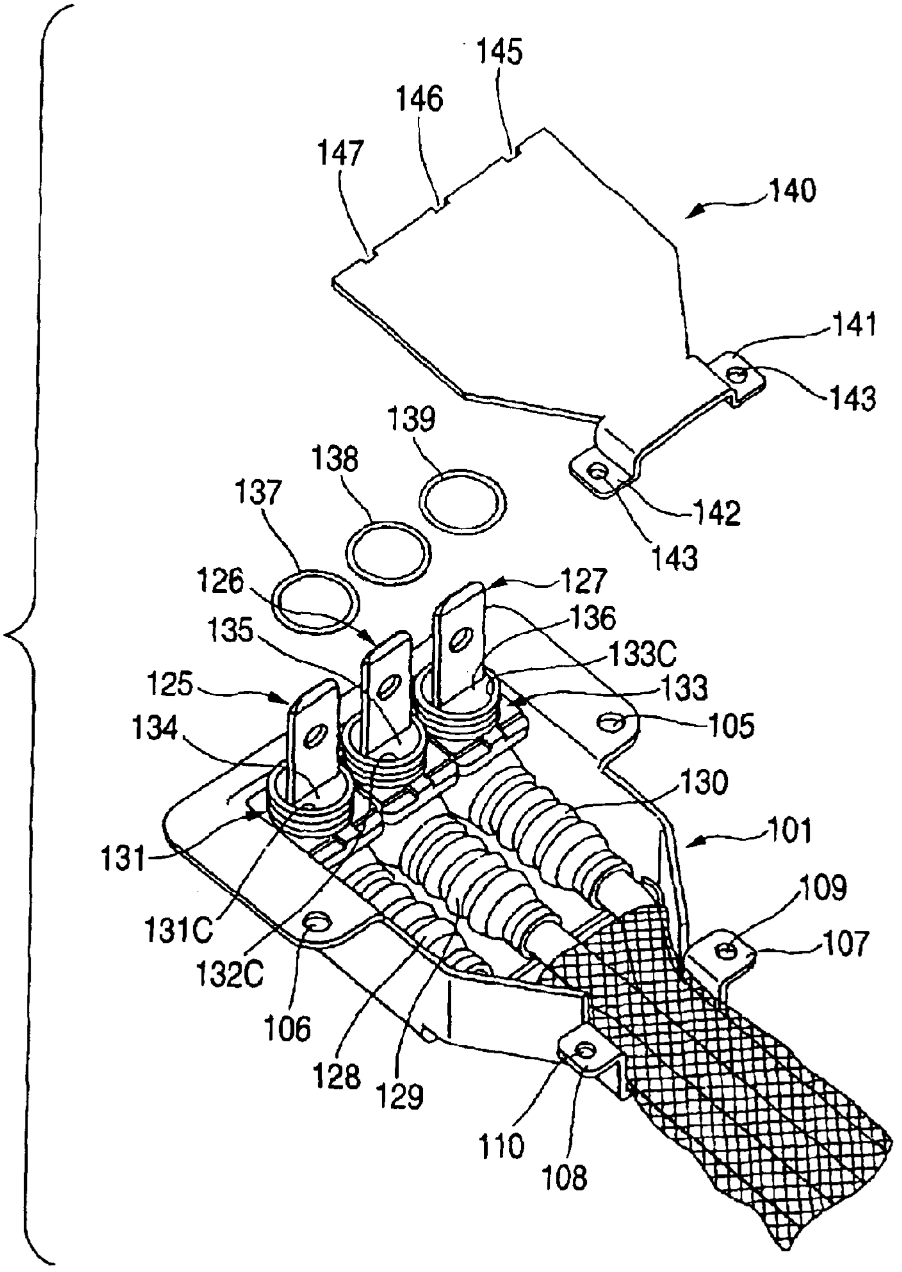
FIG. 10 is a perspective view of the electric connector of FIG. 7 in its assembled condition.
Figure 11:
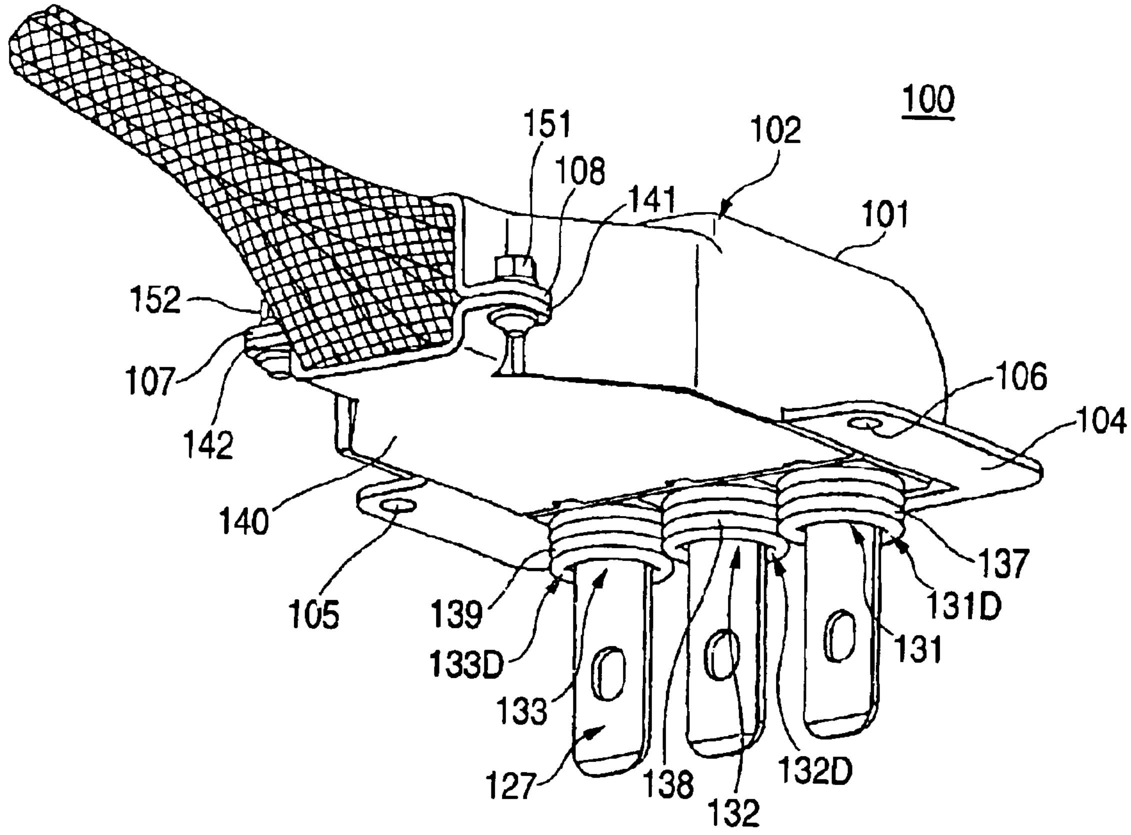
FIG. 11 is a perspective view showing the assembled electric connector of FIG. 7 from the lower side.
Figure 12:
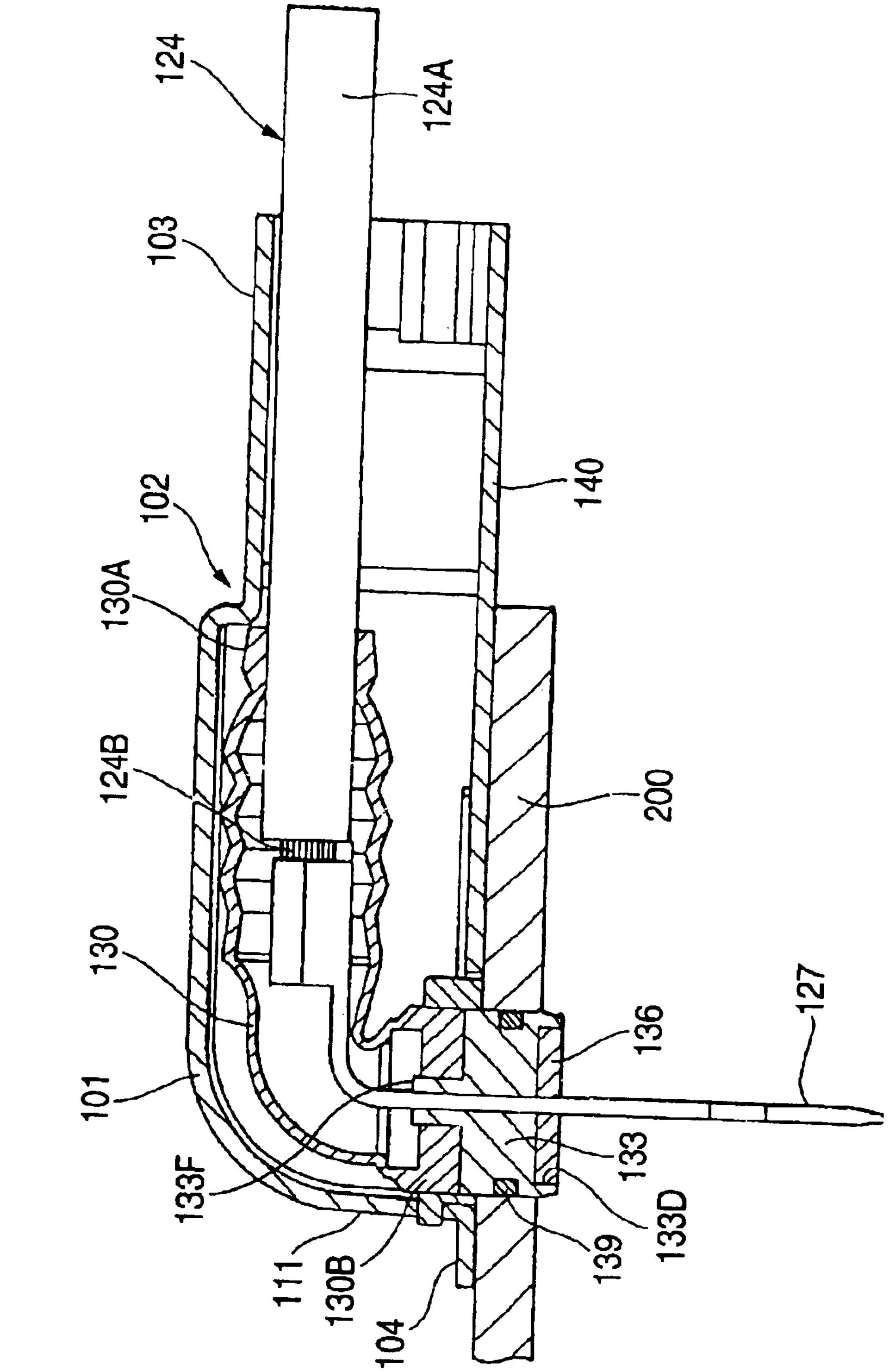
FIG. 12 is a cross-sectional view showing a condition in which the electric connector of FIG. 7 is mounted on a mounting member.

FIG. 7 is a perspective view showing the whole of an electric connector employing the electromagnetic shielding structure with the oilproof and waterproof ability, FIGS. 8 to 10 are a perspective view of the electric connector of FIG. 7 in its assembled condition, FIG. 11 is a perspective view showing the whole of the assembled electric connector of FIG. 7 from the lower side, and FIG. 12 is a cross-sectional view showing a condition in which the electric connector of FIG. 7 is mounted on a mounting member.

In FIGS. 7 to 10, the electric connector 100 includes a shell 101 in which an electric connector body 120 is received. The shell 101 is made of metal (or an electrically-conductive resin), and is formed into a box-like shape having one open end, and a step portion 102 is formed near to the open end to reduce the depth of the shell. A base portion of a shell open end portion 103, having the step portion 102 formed thereon, is tapering. An end portion of a braid 121, covering three wires 122, 123 and 124, is gripped by the shell open end portion 103. A U-shaped flange 104 is formed at a lower edge of a side wall of the other end portion of the shell remote from the shell open end portion 103. Bolt holes 105 and 106 each for the passage of a bolt therethrough are formed through opposite end portions of the flange 104, respectively. Shield stopper-mounting flanges 107 and 108 are formed respectively at lower edges of opposed side walls of the distal end portion of the shell open end portion 103. Bolts holes 109 and 110 each for the passage of a bolt therethrough are formed through the shield stopper-mounting flanges 107 and 108, respectively. Rectangular slits 112, 113 and 114 are formed through an end wall 111 of the shell 101 remote from the shell open end 103, and are spaced at suitable intervals. Flange-like projections 131C, 132C and 133C, formed respectively on resin-molded housings 131, 132 and 133 (described later) are engaged in the slits 112, 113 and 114, respectively. By engaging the flange-like projections 131C, 132C and 133C of the resin-molded housings 131, 132 and 133 respectively in the slits 112, 113 and 114, the resin-molded housings 131, 132 and 133 are positively mounted on the shell 101 against disengagement therefrom.

The electric connector body 120 has the following construction. Namely, insulators 122A, 123A and 124A are removed respectively from the end portions of the three wires 122, 123 and 124 covered with the braid 121, so that conductors 122B, 123B and 124B are exposed. L-shaped metal terminals 125, 126 and 127 are press-fastened to the exposed conductors 122B, 123B and 124B, respectively. The wires 122, 123 and 124 are covered with the braid 121 formed by weaving electrically-conductive wire elements, and the braid 121 absorbs electromagnetic waves, generated from the wires 122, 123 and 124 carrying, for example, large current and high voltage, and therefore the braid 121 shields these wires so that the electromagnetic waves will not be radiated to the exterior. The braid 121, serving as a shielding member, is formed by weaving metal wire elements, and another well known type is formed by a method in which a Cu-plated wire element is spirally wound around a wire, made of a resin such as polyester, to provide a mesh-forming wire element, and these mesh-forming wire elements are woven into a tubular shape. Grommets 128, 129 and 130 are fitted on the wires 122, 123 and 124, respectively.

The resin-molded housings 131, 132 and 133 are mounted on the L-shaped metal terminals 125, 126 and 127, respectively. The resin-molded housing 131 includes a cylindrical portion 131A of a cylindrical shape. The retaining member 131 C in the form of a plate with a predetermined thickness is formed at one end of the cylindrical portion 131A, and a hole 131B which is generally equal in diameter to the cylindrical portion 131A is formed in the retaining member 131C. A distal end portion 128B of the grommet 128 (described later) is snugly fitted into the hole 131B in the retaining member 131C. A filling portion 131D is formed at the other end of the cylindrical portion 131A of the resin-molded housing 131, and a filler 134 (described later) is filled in this filling portion 131D.

An engaging projection 131E is formed on and projects outwardly from one side of the retaining member 131C of a rectangular shape. A rectangular projection 131F is provided in the hole 131B in the retaining member 131. A slit 131G is formed through the rectangular projection 131F and the cylindrical portion 131A. By fitting the L-shaped metal terminal 125 into this slit 131G, the housing 31 is mounted on the metal terminal 125. FIG. 9 shows the condition in which the housing 131 is mounted on the metal terminal 125.

The resin-molded housings 132 and 133 on which the L-shaped metal terminals 126 and 127 are mounted, respectively, have the same construction as that of the resin-molded housing 131, and therefore explanation thereof will be omitted here.

For assembling this electric connector, first, distal end portions 125A, 126A and 127A of the L-shaped metal terminals 125, 126 and 127 are fitted respectively into the slits 131G, 132G and 133G of the resin-molded housings 131, 132 and 133, and each of the resin-molded housings 131, 132 and 133 is slid to a position near to a L-shaped corner portion of the metal terminal 125, 126, 127. Thereafter, the filler 134, 135, 136 is poured into the filling portion 131D, 132D, 133D in the cylindrical portion 131A, 132A, 133A of the resin-molded housing 131, 132, 133. The filler 134, 135, 136 is of the type which satisfactorily adheres to a steel material and a resin material, and has oil-resistance and thermal resistance. Examples of such filler includes an urethane resin, an acrylic resin, an epoxy resin and a hot-melt resin.

After the filler 134, 135, 136 is poured into the filling portion 131D, 132D, 133D in the cylindrical portion 131A, 132A, 133A of the resin-molded housing 131, 132, 133, an O-ring 137, 138, 139 is mounted on the cylindrical portion 131A, 132A, 133A of the resin-molded housing 131, 132, 133. When the cylindrical portion 131A, 132A, 133A of the resin-molded housing 131, 132, 133 is mounted in a mounting hole 201, 202, 203 in the mounting member 200, the O-ring 137, 138, 139 fills in a gap between the cylindrical portion 131A, 132A, 133A of the resin-molded housing 131, 132, 133 and an inner surface of the mounting hole 201, 202, 203.

When the resin-molded housing 131, 132, 133 is thus mounted on the metal terminal 125, 126, 127, the distal end portion 128B, 129B, 130B of the grommet 128, 129, 30, beforehand fitted on the wire 122, 123, 124, is snugly fitted into the hole 131B, 132B, 133B in the retaining member 131C, 132C, 133C of the resin-molded housing 131, 132, 133. As a result, the wire 122, 123, 124 is sealingly connected to the resin-molded housing 131, 132, 133 by the distal end portion 128B, 129B, 130B of the grommet 128, 129, 130.

Thus, the filler 134, 135, 136 is poured into the filling portion 131D, 132D, 133D in the cylindrical portion 131A, 132A, 133A of the resin-molded housing 131, 132, 133, and when the distal end portion 128B, 129B, 130B of the grommet 128, 129, 30 is snugly fitted into the hole 131B, 132B, 133B in the retaining member 131C, 132C, 133C of the resin-molded housing 131, 132, 133, the engaging projection 131 E, 132E, 133E of the retaining member 131C, 132C, 133C of the resin-molded housing 131, 132,133 is fitted in the slit 112, 113,114 in the shell 101, so that the end portions of the three wire assemblies (where the resin-molded housings 131, 132 and 133 are connected respectively to the grommets 128, 129 and 130) are mounted in the shell 101.

Thereafter, a shield stopper 140 is secured to the shell 101. This shield stopper 140 has the same shape as that of the opening in the shell 101, and flanges 141 and 142 for being mated respectively with the flanges 107 and 108 of the shell 101 are formed at one end of the shield stopper 140, and bolt holes 143 and 144 each for the passage of the bolt therethrough are formed through the flanges 141 and 142, respectively. Recesses 145, 146 and 147 are formed in the shield stopper 140, and an engaging projection 148, 149, 150, formed at that side of the retaining member 131C, 132C, 133C of the resin-molded housing 131, 132, 133 disposed adjacent to the cylindrical portion 131A, 132A, 133A, is engaged in the recess 145, 146, 147. This shield stopper 140 serves to hold the retaining members 131C, 132C and 133C of the resin-molded housings 131, 132 and 133 so that the resin-molded housings 131, 132 and 133, mounted in the shell 101, will not be disengaged therefrom.

Thus, the shield stopper 140 is attached to the shell 101, and the flanges 107 and 108 of the shell 101 are mated respectively with the flanges 141 and 142 of the shield stopper 140, and the bolt 151 is passed through the bolt holes 109 and 143 while the bolt 152 is passed through the bolt holes 110 and 144, thereby fastening the shield stopper 140 to the shell 101. As a result, the end portion of the braid 121, covering the wires 122, 123 and 124, is fixed by the shell 101 and the shield stopper 140, so that the electric connector 100 is assembled as shown in FIG. 11.

In the electric connector 100 of this construction, a proximal end portion 128A, 129A, 130A of the grommet 128, 129, 130 is held in intimate contact with the wire 122, 123, 124, thereby preventing water from intruding into the grommet 128, 129, 130 along the wire 122, 123, 124. In the electric connector 100 of this construction, the distal end portion 128A, 129A, 130A of the grommet 128, 129, 130 is snugly fitted in the resin-molded housing 131, 132, 133, thereby preventing water (intruded into the shell 101) from flowing through the resin-molded housing 131, 132, 133 toward the distal end portion 125A, 126A, 127A of the metal terminal 125, 126, 127, thus preventing the water from intruding into the interior of the mounting member along the distal end portion 125A, 126A, 127A of the metal terminal 125, 126, 127.

FIG. 12 shows the condition in which the electric connector 100 of this construction is mounted on the mounting member 200. For mounting the electric connector 100 on the mounting member 200, the cylindrical portions of the resin-molded housings 131, 132 and 133 are fitted respectively in the mounting holes 201 to 203 formed in the mounting member 200, with the shield stopper 140 held in contact with the mounting member 200. Thereafter, the shell 101 is fixedly secured to the mounting member 200 by the bolts passing respectively through the bolt holes 105 and 106 formed in the flange 104.

When the shell 101 of the electric connector 100 is thus fixedly secured to the mounting member 200 by the bolts, water, flowing along the wire 122, 123, 124, is completely intercepted by the proximal end portion 128A, 129A, 130A of the grommet 128, 129, 130 held in intimate contact with the wire 122, 123, 124, and water, intruded into the shell 102, is completely intercepted by the distal end portion 128B, 129B, 130B of the grommet 128, 129, 130 snugly fitted in the resin-molded housing 131, 132, 133.

Next, the operation of this embodiment will be described.

As shown in FIG. 12, the cylindrical portions 131A, 132A and 133A of the resin-molded housings 131, 132 and 133, attached respectively to the distal end portions 128B, 129B and 130B of the grommets 128, 129 and 130, are fitted respectively in the mounting holes 201 to 203 formed in the mounting member 200 (made of electrically-conductive metal such as aluminum), for example, of a motor mounted on an electric car, thereby provisionally positioning the electric connector. Although not shown in the drawings, the mounting member 200 is connected to the ground. After this provisional positioning operation is effected, the metal shell 101 is fixedly secured to the mounting member 200 by the bolts (not shown) passing respectively through the bolt holes 105 and 106.

Electromagnetic waves, generated from the wires 122, 123 and 124 during the operation of the motor, are absorbed by a shielding conduction path leading from the braid 121 to the ground via the metal shell 101 and the mounting member 200.

When rain water intrudes into the shell 101 along the outer peripheral surface of the wire 122, 123, 124, this rain water is intercepted by the grommet distal end portion 128B, 129B, 130 snugly fitted in the resin-molded housing 131, 132, 133, and is also intercepted by the O-ring 137, 138, 139 fitted on the outer peripheral surface of the cylindrical portion 131A, 132A, 133A of the resin-molded housing 131, 132, 133, and therefore the rain water will not reach the interior of the mounting member 200, thus securing the required waterproof performance.

On the other hand, when oil (such as motor lubricating oil) within the mounting member 200 deposits on the distal end portion 125A, 126A, 127A of the metal terminal 125, 126, 127, and moves therealong, this oil is intercepted by the filler 134, 135, 136 filled in the filling portion 131D, 132D, 133D in the cylindrical portion 131A, 132A, 133A of the resin-molded housing 131, 132, 133, and will not leak from the mounting member 200 to the exterior, and therefore will not adversely affect other equipments. Thus, the oil (such as the motor lubricating oil) within the mounting member 200 is prevented from leakage, and the oilproof performance is secured. And besides, if water drops, developing within the mounting member 200, deposit on the distal end portion 125A, 126A, 127A of the metal terminal 125, 126, 127, and tend to leak to the exterior of the mounting member 200, the water drops are intercepted by the filler 134, 135, 136 filled in the filling portion 131D, 132D, 133D in the cylindrical portion 131A, 132A, 133A of the resin-molded housing 131, 132, 133.

Figure 13:
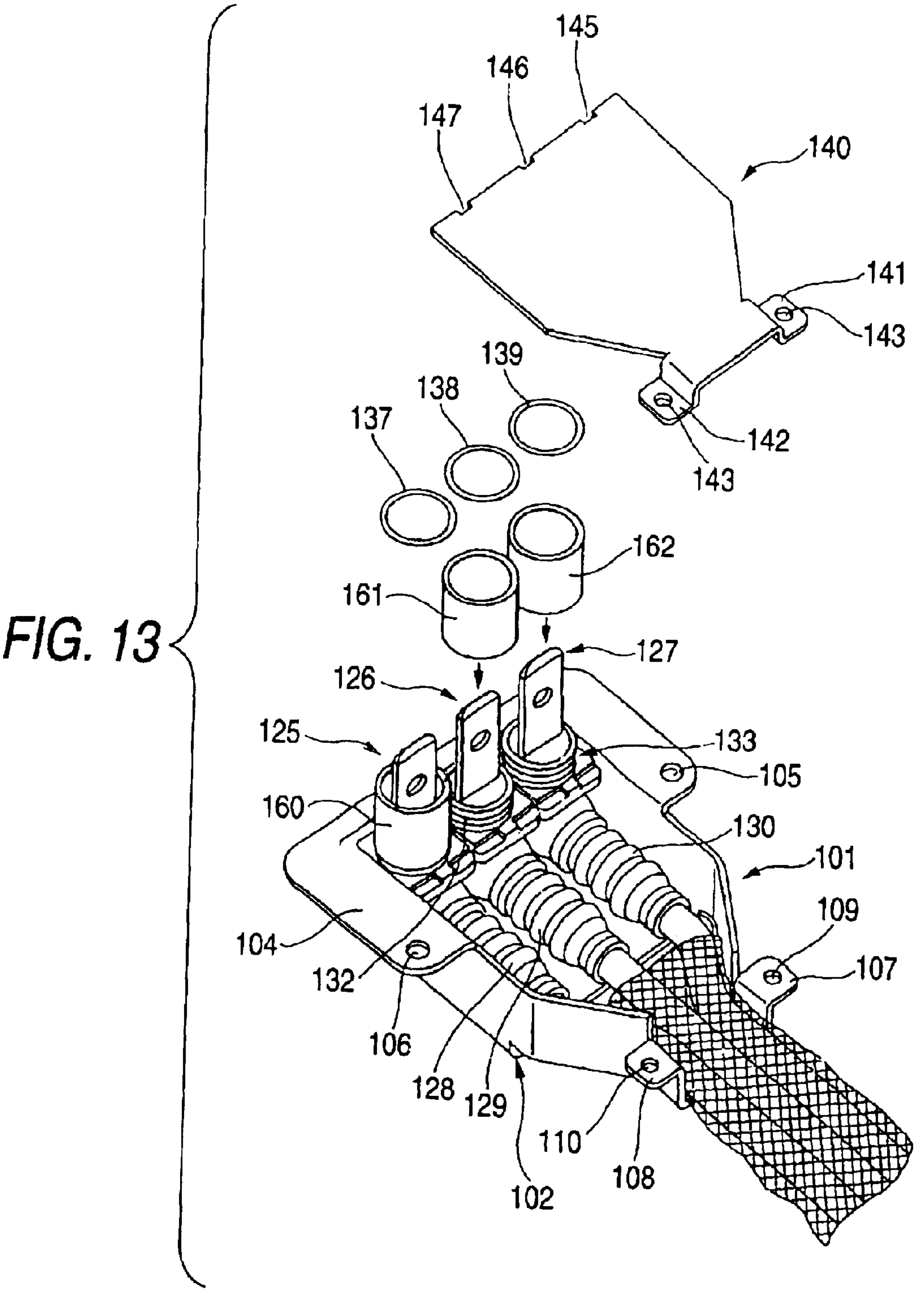
FIG. 13 is an exploded, perspective view of a third embodiment of an electric connector of the invention employing an electromagnetic shielding structure with an oilproof and waterproof ability.
Figure 14:
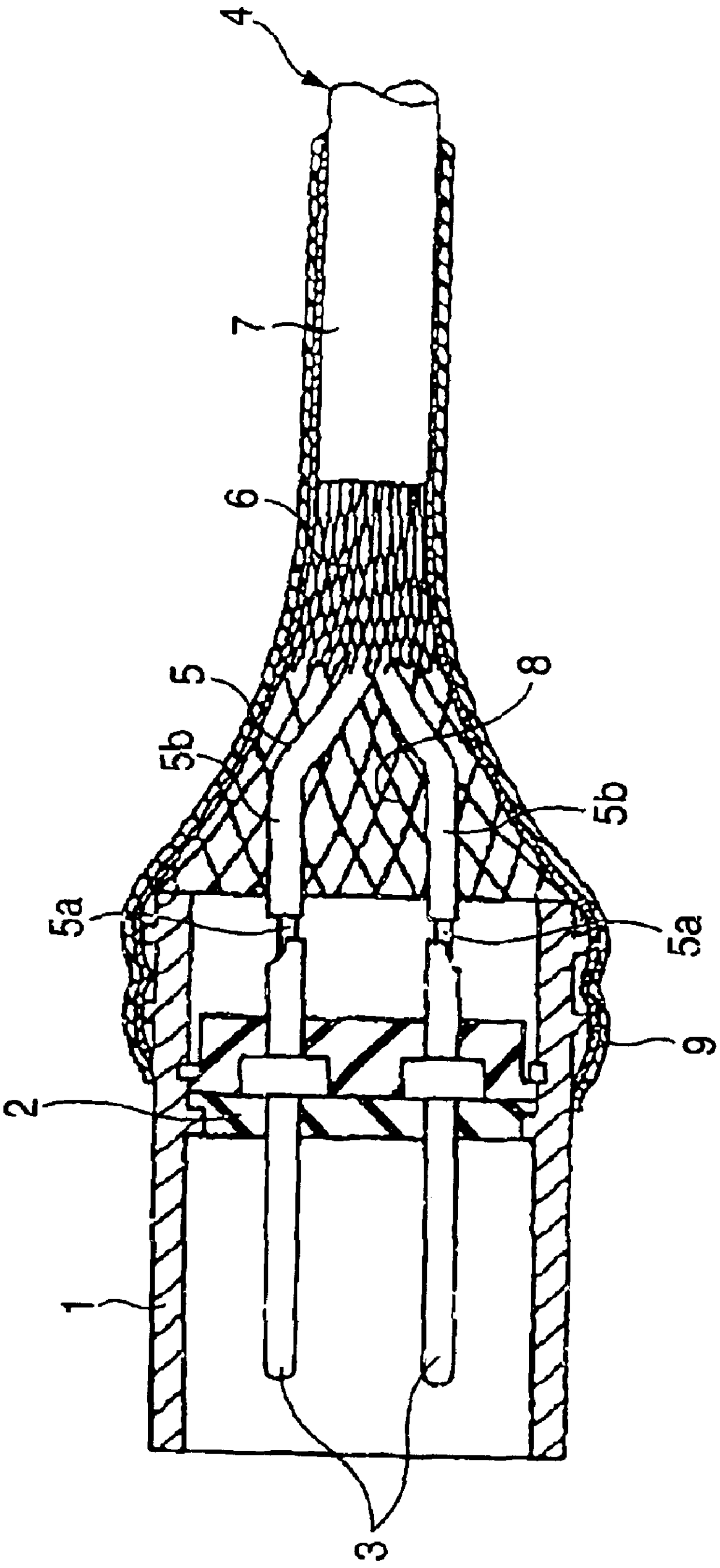
FIG. 14 is side cross-sectional view of one related electromagnetic shielding structure in an assembled condition.
Figure 15:
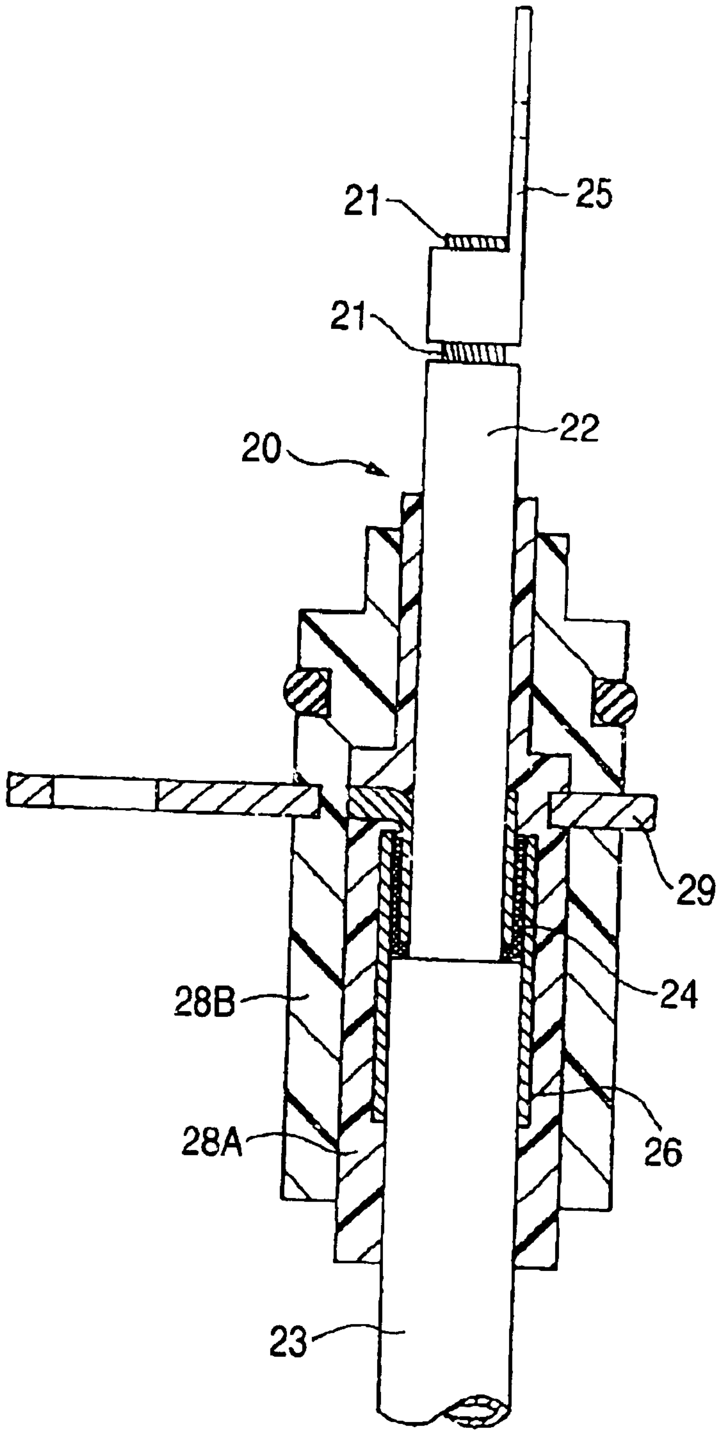
FIG. 15 is a side cross-sectional view of another related electromagnetic shielding structure in an assembled condition.

FIG. 13 shows a further embodiment of an oilproof/waterproof electromagnetic shielding structure of the invention having modified oilproof/waterproof seals provided respectively on resin-molded housings mounted on a mounting member 200. This embodiment differs from the embodiment of FIG. 10 in the following points. In the embodiment of FIG. 10, a seal between the filling portion 131D, 132D, 133D of the cylindrical portion 131A, 132A, 133A of the resin-molded housing 131A, 132A, 133A and the metal terminal 125, 126, 127 is formed by the filler 134, 135, 136 poured into the filling portion 131D, 132D, 133D of the cylindrical portion 131A, 132A, 133A. On the other hand, in this embodiment, a seal is formed by a heat-shrinkable tube 160, 161, 162 which is shrunk by heat to fit on a cylindrical portion 131A, 132A, 133A and a metal terminal 125, 126, 127.

Namely, in the embodiment of FIG. 10, the filler 134, 135, 136 is filled in the filling portion 131D, 132D, 133D of the cylindrical portion 131A, 132A, 133A of the resin-molded housing 131, 132, 133, and the leakage of oil (such as a motor lubricating oil) within the mounting member 200 is prevented by the filler 134, 135, 136. On the other hand, in this embodiment, the heat-shrinkable tube 160, 161, 162 is fitted on the outer peripheral surface of the cylindrical portion 131A, 132A, 133A of the resin-molded housing 131, 132, 133 and the metal terminal 125, 126, 127, and then this heat-shrinkable tube 160, 161, 162 is shrunk by heat, and by this shrinking force of the heat-shrinkable tube 160, 161, 162, a seal is formed between a slit 131G, 132G, 133G (formed through a rectangular projection 131F, 132F, 133F and the cylindrical portion 131A, 132A, 133A) and the metal terminal 125, 126, 127 projecting from the slit 131G, 132G, 133G, thereby preventing the leakage of the oil (such as the motor lubricating oil) from the mounting member 200.

What is claimed is:

1. An electromagnetic shielding structure, comprising:

a sheath wire, having a conductive wire and an insulative sheath covering the conductive wire;

a terminal fitting, clamping the conductive wire exposed from the insulative sheath, and the terminal fitting passing through a conductive mounting member connected to ground;

a molding member, molding so as to cover the sheath wire, the exposed conductive wire and the terminal fitting, and having a first recess and a second recess;

wherein the first recess is formed on a first end portion of the molding member, the first end portion contacting the sheath wire;

wherein the second recess is formed on a second end portion of the molding member, the second end portion contacting the terminal fitting;

a conductive braid, having a tubular shape, and covering the sheath wire and the molding member for absorbing an electromagnetic wave generated from the conductive wire;

a first sealing portion, provided in the first recess so as to adhere the molding member and the insulative sheath for securing a waterproof performance;

a second sealing portion, provided in the second recess so as to adhere the molding member and the terminal fitting for securing an oil proof and waterproof performance; and a conductive shell, covering the molding member so that the conductive braid is electrically connected to the conductive mounting member.

2. The electromagnetic shielding structure as set forth in claim 1, wherein a end portion of the conductive braid and the conductive shell are mounted on the mounting member by a bolt.

3. The electromagnetic shielding structure as set forth in claim 1, wherein the first sealing portion is formed by filing a melted resin into the first recess.

4. The electromagnetic shielding structure as set forth in claim 1, wherein the second sealing portion is formed by filing a melted resin into the second recess.

5. An electromagnetic shielding structure, comprising:

a sheath wire, having a conductive wire and an insulative sheath covering the conductive wire;

a terminal fitting, clamping the conductive wire exposed from the insulative sheath, and the terminal fitting passing through a conductive mounting member connected to ground;

a grommet, covering the sheath wire and the terminal fitting, and having a first end portion and a second end portion, the first end portion being closely contact with the insulative sheath;

a conductive braid, having a tubular shape, and covering the sheath wire and the grommet for absorbing an electromagnetic wave generated from the conductive wire;

a housing, formed with a recess at a distal end side of the terminal fitting, the housing fitting the terminal fitting, and being closely contact with the second end portion of the grommet;

a sealing portion, provided in the recess so as to adhere the housing and the terminal fitting for securing an oil proof and waterproof performance;

a conductive shell, covering the molding member and the grommet; and a shield stopper, fixedly secured to the conductive shell, and holding the housing in the conductive shell.

6. An electromagnetic shielding structure, comprising:

a sheath wire, having a conductive wire and an insulative sheath covering the conductive wire;

a terminal fitting, clamping the conductive wire exposed from the insulative sheath, and the terminal fitting passing through a conductive mounting member connected to ground;

a grommet, covering the sheath wire and the terminal fitting, and having a first end portion and a second end portion, the first end portion being closely contact with the insulative sheath;

a conductive braid, having a tubular shape, and covering the sheath wire and the grommet for absorbing an electromagnetic wave generated from the conductive wire;

a housing, fitting the terminal fitting;

a heat-shrinkable tube, sealing the housing and the terminal fitting, and closely fitted with the second end portion of the grommet;

a conductive shell, covering the housing and the grommet; and a shield stopper, fixedly secured to the conductive shell, and holding the housing in the conductive shell.

* * * * *